United States Patent [19]

Stephens

[11] 4,268,347

[45] May 19, 1981

[54] LOW REFLECTIVITY SURFACE FORMED BY PARTICLE TRACK ETCHING

[75] Inventor: Richard B. Stephens, New Providence, N.J.

[73] Assignee: Exxon Research & Engineering Co., Florham Park, N.J.

[21] Appl. No.: 6,549

[22] Filed: Jan. 26, 1979

[51] Int. Cl.³ .................. B44C 1/22; C03C 15/00; C03C 25/06; B29C 17/08
[52] U.S. Cl. .................. 156/628; 156/643; 156/654; 156/663; 156/668
[58] Field of Search .............. 156/628, 643, 657, 663, 156/668, 654; 148/1.5, 187; 136/89 CC, 895 G; 250/472, 492 A

[56] References Cited

U.S. PATENT DOCUMENTS

| | | | |
|---|---|---|---|
| 3,808,068 | 4/1974 | Johnson et al. | 156/628 X |
| 3,811,999 | 5/1974 | Fleischer et al. | 156/643 X |
| 3,852,134 | 12/1974 | Bean | 156/643 |
| 4,147,564 | 4/1979 | Magee et al. | 156/628 X |

OTHER PUBLICATIONS

Endeavor, vol. 26, pp. 79-84 (1967), Structural and Functional Adaptation in a Visual System, by C. G. Bernhard.

Nuclear Tracks in Solids, Principles and Application by R. L. Fleischer et al., 1975, pp. 16, 18-20, 65-72 and 75.
Nature, vol. 244, Aug. 3, 1973, pp. 281-282.
J. Voc. Sci. Technol., vol. 12, No. 5, Sep./Oct. 1975, Solar-Energy Materials Preparation, Techniques by D. M. Mattox, pp. 1023-1031.
J. Opt. Soc. Am., vol. 66, No. 6, Jun. 1976, Single-Layer, Gradient Refractive Index Antireflection Films effective from 0.35-2.5u, by M. J. Minot, pp. 515-519.

Primary Examiner—William A. Powell
Attorney, Agent, or Firm—D. W. Collins; Paul E. Purwin

[57] ABSTRACT

Low reflectivity surfaces are formed by particle track etching of a dielectric material such that the horizontal scale of surface texture is less than the wavelength of incident radiation and the depth of texture is equal to or greater than said wavelength. As a consequence, the reflection coefficient is thereby reduced by a factor of at least two, and light is more efficiently transmitted into the material. For solar cells encapsulated in transparent material, efficiency of absorption of solar radiation may be improved by at least about two times per etched surface, or to less than about 2% for the air/transparent material interface and to less than about 15% for the transparent material/solar cell interface.

7 Claims, 4 Drawing Figures

LOW REFLECTIVITY SURFACE FORMED BY PARTICLE TRACK ETCHING

BACKGROUND OF THE INVENTION

1. Field of the Invention

The invention relates to a technique for controlling the optical properties of material surfaces. More particularly, the invention relates to an improvement in the transmission of light into and through an insulating material employing etching of a surface bombarded by high energy radiation.

2. Background of the Invention

It is preferable in many instances to reduce light reflection from the surfaces of insulating materials. For example, solar thermal absorber glazings can obviously be made more efficient in operation by reducing light reflection; see, for example, Journal of Vacuum Science and Technology, Vol. 12, pages 1023–1031 (1975). Other optical components for which reduction in light reflection improves operating efficiency are also apparent.

One way to reduce light reflection is by adding layers on the surface of the components which operate by the interference of light reflected from the different interfaces; see, e.g., B.O. Seraphin, "Chemical Vapor Deposition Research of Fabrication of Solar Energy Converters", NSF/RANN Report SE/GI-3671x/PR/74/4, 1974. It is also known to produce interference layers by etching the surface of the component in such a way that its index of refraction is uniformly lowered in a substantially discrete layer (or two) at the surface; see, e.g., "Optical Coatings for Flat Plate Solar Collectors", ERDA Final Report COO-2625-75/1.

A common drawback of the foregoing approaches is due to the discreteness of the antireflection layer (or layers), the reflectivity is lowered only for narrow bands separated by maxima in the reflectivity. In addition, the wavelengths of the minima are sensitive to the orientation of the surface with respect to the incident radiation. In order to be useful in a specific application then, the thickness of the layer (or layers) must be precisely controlled.

It is also well-known to reduce reflectivity with a smooth gradient in the index of refraction at the surface. That is, the index of refraction varies from the bulk value (which may be between about 1.5 and 5.0) to some value close to 1 in a smooth, continuous manner as the surface is approached from the inside. In one embodiment, this is known as the "moth's eye effect"; see, for example, Endeavor, Vol. 26, pp. 79–84 (1967). The moth's eye effect takes its name from a naturally occurring phenomenon—an array of protuberances of specific height and spacing—observed in the cornea of nocturnal insects. The array of protuberances which produces this effect has been reproduced using a photoresist and an interference pattern generated by a laser; see, e.g., Nature, Vol. 244, pp. 281–282 (1973). However, there was no net gain in transmission because of the absorption of the photoresist. A somewhat similar surface has been obtained, as reported in Journal of the Optical Society of America, Vol. 66, pages 515–519 (1976), by etching a phase-separated glass. Both surfaces show the characteristics of graded surfaces in that the surface reflectivity is reduced for wavelengths shorter than some transition wavelength and never go through maxima for shorter wavelengths. However, both of the foregoing techniques require special materials.

SUMMARY OF THE INVENTION

In accordance with the invention, low reflectivity surfaces are generated by particle track etching of a wide range of dielectric materials. As used herein, a dielectric material has an electrical resistivity of at least $2 \times 10^3$ ohm-cm. The process of the invention comprises bombarding a dielectric material with high energy particles, thereby generating damage tracks, and etching said particle tracks to produce a surface characterized by cavities of average depth D and of average spacing S such that for incident energy in a wavelength region defined by a minimum wavelength $\lambda_{min}$ and a maximum wavelength $\lambda_{max}$, $\lambda_{min}$ is greater than about 10S and $\lambda_{max}$ is less than about 6D. The textured surface thereby generated is of a form useable for a broad band anti-reflection coating.

DETAILED DESCRIPTION OF THE INVENTION

Nuclear tracks in solids have been studied for some years in order to identify the damage tracks of high energy particles. During the course of these studies, investigators found that the trail of damage left by the passage of a high energy ion through a dielectric material could be etched out; see, e.g., R. L. Fleischer et al, *Nuclear Tracks in Solids*, University of California Press, 1975. Dielectric materials suitable for use in the practice of the invention are those materials having an electrical resistivity greater than about $2 \times 10^3$ ohm-cm. Examples of such materials are listed in Table 1-1, page 16 of the foregoing reference and include insulators such as silicate minerals, alkali halides, insulating glasses and polymers ($\rho = 10^6$ to $10^{20}$ ohm-cm), poor insulators such as $MoS_2$ ($\rho = 3 \times 10^3$ to $2.5 \times 10^4$ ohm-cm) and semiconductors such as $V_2O_5$ glass ($\rho = 2 \times 10^3$ to $2 \times 10^4$ ohm-cm).

Figure 1:
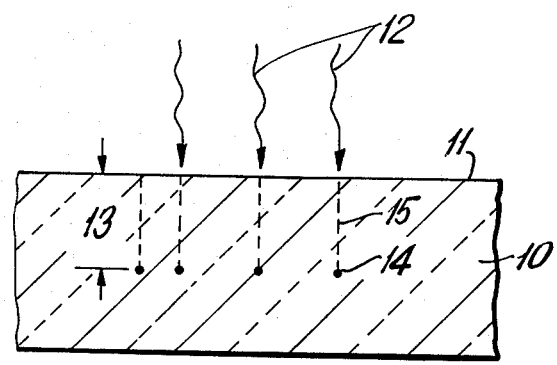
FIG. 1, in cross-section, is a fragmentary view illustrating irradiation of a dielectric sample with high energy particles.

Unexpectedly, I have found by suitable adjustments in the density of the ions used to bombard a dielectric surface and by modifications of the etching procedure that a highly controlled surface morphology can be obtained. Further, this surface morphology can produce a low reflectivity surface. Such low reflectivity surfaces, of course, are useful in a variety of applications, including applications requiring transmission of energy in the near-infrared, optical and ultraviolet wavelength regimes into and/or through a transparent material. The practice of this invention requires two steps. The first, shown in FIG. 1, is the exposure of a sample 10 having a surface 11 to a collimated beam of high energy ions 12. The ions may be nuclear fission fragments or any of a number of elements well-known to those skilled in the art of particle track etching. Examples of nuclear fission fragments sources include $^{235}$U, $^{238}$U, $^{232}$Th, $^{244}$Pu and cosmic rays. Examples of other elements commonly used in particle track etching and the energies required for different materials are listed in the Fleischer reference, pp. 18–20. The elements range from hydrogen to iron to uranium fission fragments.

Figure 2:
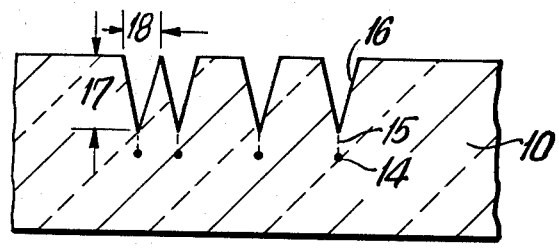
FIG. 2, in cross-section, is a fragmentary view illustrating the effect of partially chemically etching the sample shown in FIG. 1.

The particles penetrate a distance 13 into the surface and terminate at sites 14, leaving a trail or track 15 of damaged material in their wake. By exposing the sample 10 to a suitable etchant, conical holes or cavities 16, centered on each damaged track 15, are produced, as shown in FIG. 2.

The distance of penetration 13 depends on the nature of the material and the energy of the high energy radiation. The nature of the material is characterized by its absorption coefficient for the particular radiation and, as is well-known, the higher the absorption coefficient, the shallower the distance of penetration. With regard to the energy of the high energy particles, it is well-known that the higher the energy, the greater the depth of penetration into the material. In order to produce an effective low reflectivity surface in the ultraviolet, optical and near-infrared region (about 0.1 to 2 $\mu$m), it is necessary that the depth of penetration be more than the depth to which the surface is etched (less than about 1 $\mu$m). Particle track etching requires such high energy particles that this condition is easily met. Particular values may be selected from L. C. Northcliffe et al, "Range and Stopping Power Tables for Heavy Ions", Nuclear Data Tables A7, 233–463 (1970). For example, for 3 MeV particles of $^{16}$O, penetration in polymers to a depth of about 4 $\mu$m is obtained for polyethylene and about 5 $\mu$m for mylar. The depth of penetration appears to be relatively insensitive to polymer composition.

The ratio of etching depth 17 to base diameter 18 is determined by the sample material, the etchant and the etching conditions. General guidelines for etchants and conditions of etching are well-known for low concentrations of damaged tracks. However, in order to obtain spacing between the tracks such that the scale S of the texture achieved when the conical cavities overlap is sufficiently small, a much higher than usual density of damage tracks is required, and in some cases, the etchants and etching conditions must be modified for optimum results. In all cases, the etch times are drastically shortened or etchant strengths weakened, since much smaller holes are required than for conventional single track detection.

For example, the recipe for etching irradiated fused quart (Fleischer et al, Table 2—2) calls for immersion in 28 mol % HF for one minute at room temperature. That etches too rapidly for my purposes. I found that a convenient etch is 10 mol % HF for 90 seconds at room temperature. Equivalently and somewhat safer, I have also used 2.5 wt. % $NH_4HF_2$ in water for 6 minutes at room temperature. It should be noted that when the HF solution is reduced to 1 mol %, there is no observed particle track etching (it is known in some materials that the ratio of track etch rate to bulk etch depends on the etch strength; for this very weak etch, the ratio probably goes to 1). The conical cavities produced by the HF etch are about 1200Å in diameter and 1500Å deep; equivalent to a track to bulk etching ratio of 3.5. It would be preferable if the ratio were considerably larger; than increases D for a given S and thus increases the wavelength range of the low reflectivity window. However, a ratio of 3.5 is as good as has been achieved in silica (Fleischer et al, Table 2-3). Much sharper cones (larger ratios) can be produced in plastics, but as with silica, the etch rate must be reduced to achieve a manageable etch time. The etch strength and temperature can typically be reduced somewhat without reducing the ratio, but there are limitations which depend on material, the proprietary additives, and the impurities in the material. For example, the polycarbonates LEXAN (tradename of General Electric, Schenectady, NY) and CR-39 (available from the Homelite Corp., Wilmington, Del.) have nominally the same composition but are made by different processes. When subjected to particle track etching employing prior art parameters, the LEXAN material evidences an irregular surface, while the CR-39 material evidences cleaner, sharper cavities.

The dimensions of surface morphology required for low reflectivity are related to the maximum wavelength $\lambda_{max}$ and the minimum wavelength $\lambda_{min}$ for which one wishes to reduce the surface reflection. The depth 17 of the cavities 16 should be greater than about $\lambda_{max}/6$ and the separation 18 between the cavities should be less than about $\lambda_{min}/10$. That is, the surface is characterized by cavities of average depth D and average spacing S such that for incident radiation in the wavelength region $\lambda_{min}$ to $\lambda_{max}$, $\lambda_{min}$ is greater than about 10S and $\lambda_{max}$ is less than about 6D. The coefficients depend somewhat on the particular material. For example, a textured metal surface or material having a high index of refraction (n~4) scatters much more efficiently than a textured dielectric surface or material having a low index of refraction (n~1.5-2), and for that case, the minimum wavelength $\lambda_{min}$ is about 20S.

The spacing between cavities is determined by the density of the particles with which the samples have been bombarded. In order to use the surface as a low reflection coating for solar energy applications, the particle density ranges from about $10^{10}$ cm$^{-2}$ to $4 \times 10^{12}$ cm$^{-2}$ so that the spacing between the cavities, which determines S, must be sufficiently less than the shortest wavelength of light to be absorbed (about 0.1 $\mu$m).

Figure 3:
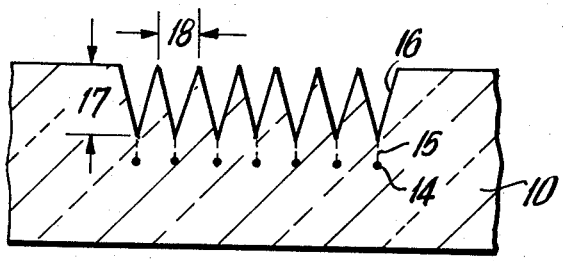
FIG. 3, in cross-section, is a fragmentary view illustrating a textured surface which is produced by the process of the invention as illustrated in FIGS. 1 and 2.

The depth to which the cavities may be etched is then set by the cone angle (which depends on the material, the etchant and the etching conditions) and is insensitive to etching time, because once the cones overlap, the surface achieves a steady state, as shown in FIG. 3. The surface morphology is conveniently measured by taking transmission electron micrographs of a shadowed acetate replica of the surface.

In the case of employing a low reflectivity surface for solar applications, where $\lambda_{max} = 2$ $\mu$m and $\lambda_{min} = 0.3$ $\mu$m, the cavities must be at least about 7 times deeper than wide, thereby providing a cone angle of less than about 4° (the angle between the cone wall and the particle track). This condition is easily achieved with most plastics and minerals. The cone angles in silica and other oxide glasses are somewhat larger and this reduces considerably the spectral width, $\lambda_{min}$ to $\lambda_{max}$, of the low reflectivity window.

To produce a high temperature solar energy absorbing surface, a highly cross-linked plastic is preferably employed. Examples include polyacrylonitrile, polyvinylidene chloride and rayon. The plastic is exposed to a collimated beam of high energy ions. The total flux is about $10^{10}$ cm$^{-2}$ in order to generate 0.1 $\mu$m diameter conical cavities (the necessary condition, as given previously, is that the bases of the cavities should overlap and not leave much flat, unetched surface). The ions should penetrate deeper than the etchant so that the holes will have sharp bottoms; 4 MeV $^{16}$O ions with a penetration depth of about 5 μm are suitable.

The catastrophic damage left in the wake of the heavy ion etches much faster than the undamaged plastic, and consequently one can etch conical cavities, the depths of which are several times the base diameter, as previously described.

If desired, the plastic is transformed into a high temperature stable material by carbonization through slow heating, as is done in the production of high modulus carbon fibers. The technique is well-known and forms no part of this invention. The general procedure is as follows: At first, heating in oxygen is done to further cross-link the molecular structure. At about 250° C., heating is done in an inert gas. By about 2000° C., the material is substantially pure carbon. Inasmuch as there is considerable gas evolution and shrinkage during heating, the plastic should be as thin as practicable for easy diffusion and low stress. A convenient thickness range is about 1 to 10 mils.

If the surface is to be used at a temperature at which it might burn, it might be desirable to react the carbon with silicon vapor to form a refractory SiC layer. This procedure can be used with any one of a number of materials which react to form a refractory carbon compound, of which SiC is a good example. The only precaution is that the reacted layer cannot be so thick as to obliterate the texture on the surface. A thickness of order of hundreds of Angstroms would be satisfactory. After processing, the surface would have to be adhered to a convenient substrate with a high temperature stable glue.

EXAMPLES

Example 1

A fused silica plate was exposed to $^{63}$Cu$^{8+}$ ions having an energy of 63 MeV for a total dosage of $1 \times 10^{10}$ particles/cm$^2$. The plate was then etched for 90 sec in 10% aqueous HF at room temperature. Plastic replicas of the surface were made and shadowed by conventional processing. Shadowing was done with a heavy metal (uranium) at about 70° from normal, so that shadows observed by transmission electron microscope were about three times as long as cones were high. The measured surface morphology showed cavities of average depth of about 0.15 μm and average spacing of about 0.07 μm.

Example 2

Figure 4:
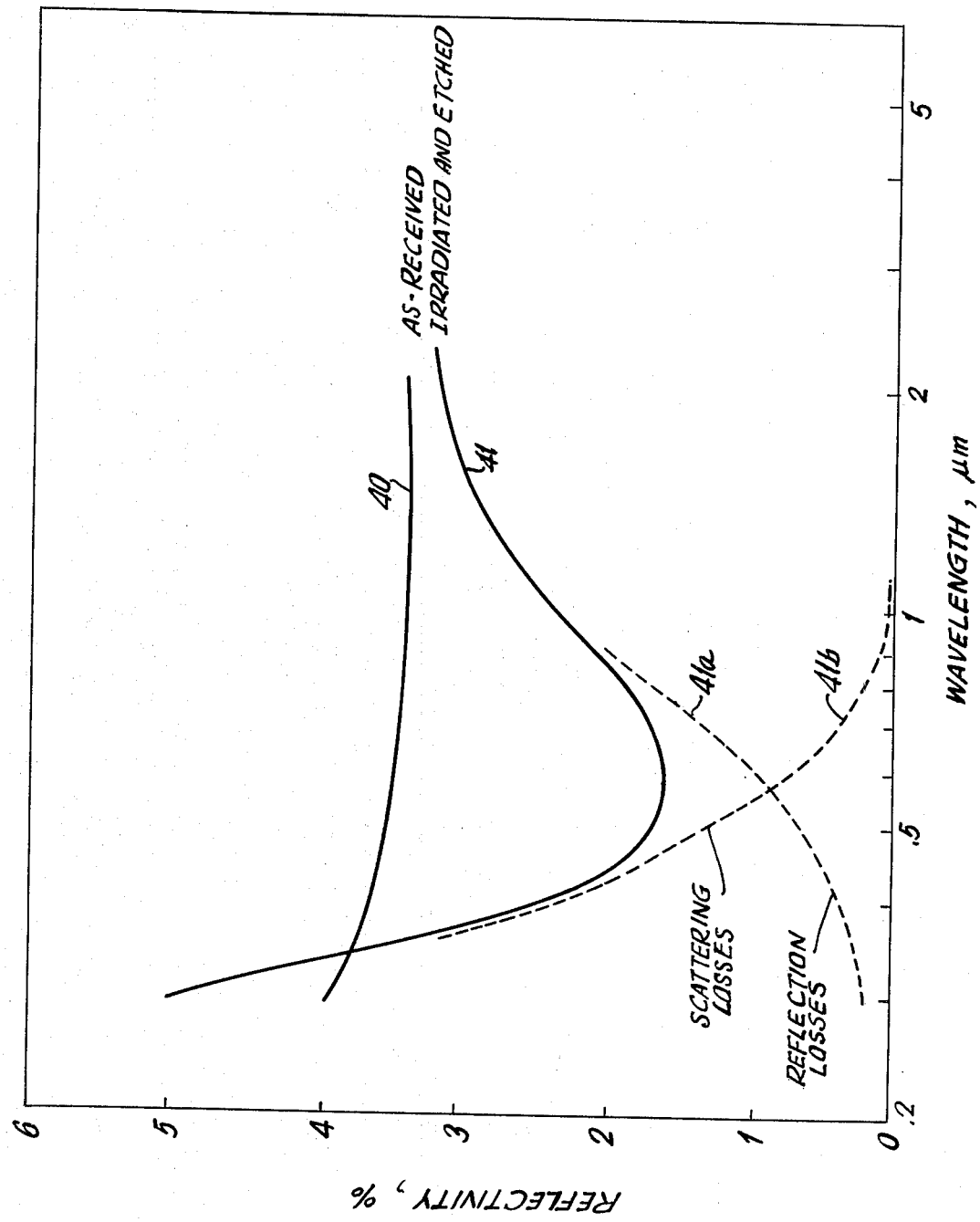
FIG. 4, on coordinates of reflectivity and wavelength, depicts the surface transmission losses of fused quartz before and after particle track etching.

A second fused silica plate was treated to produce a rough surface by particle track etching, employing 63 MeV $^{63}$Cu$^{8+}$ ions at the same dosage as in Example 1. The chemical etching conditions were also the same as in Example 1. Transmission studies showed a reduction in surface transmission loss of about 50% at 5000Å as compared to that of an untreated surface, as depicted in FIG. 4. In FIG. 4, an as-received fused quartz plate evidences a fairly constant surface transmission loss dependence on wavelength (curve 40). A fused quartz plate irradiated and etched in accordance with the invention, however, evidences a considerably lower surface transmission loss from about 0.4 to 1.2 μm (curve 41). Curves 41a and 41b are reflection losses and scattering losses, respectively, which, when added together, yield curve 41.

Example 3

One side of a ⅛ inch thick fused silica plate was treated to produce a rough surface by employing particle track etching, employing 63 MeV $^{63}$Cu$^{8+}$ ions as in Example 1. The track density was about $10^{10}$ cm$^{-2}$. The surface was etched in 2.5 wt. % ammonium difluoride for about 8.5 min. to produce overlapping conical holes about 1500Å deep and about 1000Å base diameter (thickness at half height = ~500Å), as deduced from transmission measurements. The transmission spectrum was virtually the same as that in Example 2.

A tellurium film 8500Å thick was vacuum evaporated onto the roughened surface at 140° C. so that the Te film coated the pores. At a wavelength of 4000Å, the quartz/Te interface evidenced about 1% reflectivity, as compared with about 50 to 70% expected for a smooth surface.

A polystyrene backing about 3400Å thick, was then applied by dipping the plate into a solution of the polymer in INHIBISOL (trademark of Penetone Corp., Tenafly, N.J.). The polystyrene layer served to protect the Te film chemically and mechanically. There should be no effect on reflectivity, since the polystyrene coating was applied to the back of the Te film only and thus does not interfere with the glass/Te interface.

What is claimed is:

1. A process for forming a surface having a low reflectivity to incident radiation in a wavelength region whose lower and upper bounds are defined by λ min about equal to 0.1 micron and λ max about equal to 2.0 microns respectively, which comprises (a) bombarding a dielectric material with high energy particles, thereby generating damage tracks, and (b) etching said damage tracks to form cavities of average depth D and average spacing S such that λ min is greater than about 10S and λ max is less than about 6D whereby incident radiation transits a gradient change in dielectric constant, substantially reducing the reflectivity of said surface.

2. The process of claim 1 in which the ratio of depth to spacing of the cavities is at least about 7.

3. The process of claim 1 in which the surface is bombarded with high energy particles having a particle density ranging from about $1 \times 10^{10}$ to $4 \times 10^{12}$ cm$^{-2}$.

4. The process of claim 1 in which the dielectric material comprises an oxide glass.

5. The process of claim 4 in which the dielectric material comprises silica.

6. The process of claim 4 in which the dielectric material comprises a plastic.

7. The process of claim 6 in which the plastic is highly cross-linked.

* * * * *